(12) United States Patent
Hachisuka et al.

(10) Patent No.: US 7,678,448 B2
(45) Date of Patent: Mar. 16, 2010

(54) GAS BARRIER FILM AND GAS BARRIER LAMINATE

(75) Inventors: Tooru Hachisuka, Ushiku (JP);
Shigenobu Yoshida, Tokyo (JP);
Chiharu Okawara, Toride (JP);
Yoshinori Kobayashi, Tsukuba (JP);
Kenji Ito, Tsukuba (JP); Hisashi Togashi, Tsukuba (JP); Kouichi Hirata, Tsukuba (JP)

(73) Assignee: Mitsubishi Plastics, Inc., Tokyo (JP)

( * ) Notice: Subject to any disclaimer, the term of this patent is extended or adjusted under 35 U.S.C. 154(b) by 781 days.

(21) Appl. No.: 10/597,425

(22) PCT Filed: Jan. 26, 2005

(86) PCT No.: PCT/JP2005/001017

§ 371 (c)(1),
(2), (4) Date: Jul. 25, 2006

(87) PCT Pub. No.: WO2005/070665

PCT Pub. Date: Aug. 4, 2005

(65) Prior Publication Data

US 2008/0254266 A1    Oct. 16, 2008

(30) Foreign Application Priority Data

Jan. 27, 2004    (JP) .............................. 2004-018518

(51) Int. Cl.
*B32B 9/00*    (2006.01)
(52) U.S. Cl. ...................... 428/336; 428/328; 428/331; 428/451
(58) Field of Classification Search ................. 428/328, 428/331, 336, 451
See application file for complete search history.

(56) References Cited

U.S. PATENT DOCUMENTS

| 5,725,958 | A | 3/1998 | Matsuda et al. |
| 5,942,320 | A | 8/1999 | Miyake et al. |
| 2001/0038894 | A1 | 11/2001 | Komada |

FOREIGN PATENT DOCUMENTS

| CN | 1176173 | | 3/1998 |
| EP | 0460796 | A | 12/1991 |
| EP | 0550039 | A | 7/1993 |
| JP | 2-050837 | A | 2/1990 |
| JP | 2-299826 | A | 12/1990 |
| JP | 07-080986 | A | 3/1995 |
| JP | 8-267637 | A | 10/1996 |
| JP | 11-268171 | A | 10/1999 |
| JP | 2002-46209 | A | 2/2002 |
| JP | 2002-192646 | A | 7/2002 |

OTHER PUBLICATIONS

International Search Report for PCT/JP2005/001017 mailed May 24, 2005.
"2.2 HR-TEM observation and ESR test of nc-Si formation" by Izumi et al., Appl Phy. Japan 70, 852 (2001), pp. 852-856 and English translation.

*Primary Examiner*—D. S Nakarani
(74) *Attorney, Agent, or Firm*—Darby & Darby

(57) ABSTRACT

The gas barrier film of the present invention is a gas barrier film comprising a base material, and an inorganic thin film composed of a silicon oxide film formed on one or both surfaces of the base material, wherein radical density of the Pb center of the silicon oxide film observed by an electron spin resonance method (ESR method) is from $1\times10^{16}$ to $1\times10^{19}$ spins/cm$^3$, or a gas barrier film comprising a base material, an inorganic thin film containing silicon oxide and the other metal component formed on one or both surfaces of the base material, wherein radical density of the Pb center of the silicon oxide in the inorganic thin film observed by an ESR method is from $13\times10^{14}$ to $3\times10^{17}$ spins/mol, and a laminate wherein at least one paper and/or plastic film is laminated on the gas barrier film.

14 Claims, No Drawings

GAS BARRIER FILM AND GAS BARRIER LAMINATE

CROSS-REFERENCE TO PRIOR APPLICATION

This is a U.S. National Phase Application under 35 U.S.C. §371 of International Patent Application No. PCT/JP2005/001017 filed Jan. 26, 2005, and claims the benefit of Japanese Patent Application No. 2004-018518 filed Jan. 27, 2004, both of which are incorporated by reference herein. The International Application was published in Japanese on Aug. 4, 2005 as WO 2005/070665 A1 under PCT Article 21(2).

TECHNICAL FIELD

The present invention relates to a gas barrier film and a gas barrier laminate.

BACKGROUND ART

Heretofore, a gas barrier film obtained by using a plastic film as a base material and forming an inorganic thin film made of aluminum oxide, magnesium oxide or silicon oxide on the surface of the plastic film using a vacuum deposition method, a sputtering method, a CVD method or an ion plating method has widely been used in packaging applications so as to package articles requiring barrier of various gases such as steam and oxygen, and to prevent deterioration of foods, industrial products and drugs. Intense interest is shown towards, in addition to packaging applications, applications of the gas barrier films to a portion of a transparent conductive sheet used in liquid crystal display, solar battery, electromagnetic wave shielding, touch panel, substrate for EL, and color filter. The gas barrier film is excellent in printability because of excellent wettability of an inorganic thin film, and is therefore widely used as a printed packaging material.

Various improvements and studies have been made for the purpose of preventing deterioration of gas barrier properties of the gas barrier deposited plastic film, and there has been known a method of improving gas barrier properties while maintaining transparency by subjecting the deposited film to a water absorption treatment and a heat treatment (see, for example, Japanese Unexamined Patent Application, First Publication No. Hei 2-299826) and a method of forming a coated layer made of various polyurethanes, various polyesters, or a mixture of polyurethane and polyester on the deposited surface (see, for example, Japanese Unexamined Patent Application, First Publication No. Hei 2-50837). Also there have been known gas barrier laminated films obtained by coating a gas barrier resin such as a mixture of a water soluble polymer and a metal alkoxide, a vinylidene chloride-based copolymer or an ethylene vinyl alcohol copolymer (hereinafter referred to as "EVOH") on the deposited surface (see, for example, Japanese Unexamined Patent Application, First Publication No. Hei 8-267637 and Japanese Unexamined Patent Application, First Publication No. Hei 7-80986).

With respect to paramagnetic defects in silicon oxide, Pb center (g value: 2.003) due to defects of an interface between Si and $SiO_2$ and E' center (g value: 2.001) due to defects of oxygen vacancy in $SiO_2$ as observed by an electron spin resonance method (ESR method) have been known (J. Appl. Phys., Jpn. 70, 852 (2001)), and there has been proposed a gas barrier film comprising silicon oxide formed by a CVD method in which radical density of the E' center observed by the ESR method is specified (see, for example, Japanese Unexamined Patent Application, First Publication No. 2002-192646).

However, gas barrier properties of a film comprising an inorganic thin film layer formed thereon described in Japanese Unexamined Patent Application, First Publication No. Hei 2-299826, Japanese Unexamined Patent Application, First Publication No. Hei 2-50837, Japanese Unexamined Patent Application, First Publication No. Hei 8-267637 and Japanese Unexamined Patent Application, First Publication No. Hei 7-80986 are still considered to be insufficient and thus a film having excellent gas barrier properties has been required.

In a gas barrier film comprising a silicon oxide thin film formed thereon described in Japanese Unexamined Patent Application, First Publication No. 2002-192646, radical density of the E' center is defined. However, the silicon oxide formed by a vacuum deposition method has a structure comprising the Pb center as a main component, and it was found to be difficult to specify the structure by the E' center so as to obtain excellent gas barrier properties by radical density.

DISCLOSURE OF THE INVENTION

Under these circumstances, the present invention has been made and an object thereof is to provide a gas barrier film having improved gas barrier properties of an inorganic thin film, and a laminate comprising the gas barrier film.

Under these circumstances, the present inventors have intensively studied so as to achieve the above object and found that it becomes possible to improve gas barrier properties by adjusting radical density of the Pb center of a silicon oxide film within a proper range in case of depositing or post-treating a gas barrier film comprising an inorganic thin film formed thereon. Thus, the present invention has been completed.

That is, the gas barrier film of the present invention includes a base material, and an inorganic thin film composed of a silicon oxide film formed on one or both surfaces of the base material, wherein radical density of the Pb center of the silicon oxide film observed by an electron spin resonance method (ESR method) is from $1\times10^{16}$ to $1\times10^{19}$ spins/cm$^3$.

The gas barrier film of the present invention includes a base material, and an inorganic thin film containing silicon oxide and the other metal component formed on one or both surfaces of the base material, wherein radical density of the Pb center of the silicon oxide in the inorganic thin film observed by an ESR method is from $13\times10^{14}$ to $3\times10^{17}$ spins/mol.

The gas barrier film of the present invention includes a base material, and an inorganic thin film containing silicon oxide formed on one or both surfaces of the base material, wherein a ratio of radical density (S2) of the Pb center measured after heating the gas barrier film at 120° C. for 24 hours to radical density (S1) of the Pb center of the inorganic thin film observed by an ESR method, (S2/S1), is 0.5 or more.

The gas barrier laminate of the present invention includes the gas barrier film, a printed layer formed on the surface of the inorganic thin film of the gas barrier film, and a heat seal layer laminated on the printed layer.

The gas barrier laminate of the present invention includes the gas barrier film comprising the inorganic thin film and a top coat layer formed on the surface of the inorganic thin film, a printed layer formed on the surface of the top coat of the gas barrier film, and a heat seal layer laminated on the printed layer.

The gas barrier film and the laminate of the present invention exhibit excellent gas barrier properties while suppressing increases of the number of steps and cost as compared with the prior art, and also exhibit sufficient gas barrier properties immediately after the production, and are therefore of great value in view of satisfactory characteristics which have recently been required to the packaging film.

BEST MODE FOR CARRYING OUT THE INVENTION

Preferred examples of the present invention will now be described. The present invention is not limited to the following respective examples and, for example, constituent elements of these examples may be appropriately combined.

As the base material in the present invention, a plastic base material is preferably used and the plastic base material is not specifically limited as far as it is made of a resin, which can be used as a conventional packaging material, as a raw material. Specific examples of the resin include base materials made of raw materials, for example, amorphous polyolefin such as polyolefin or cyclic polyolefin (homopolymer or copolymer of ethylene, propylene or butane); polyester such as polyethylene terephthalate or polyethylene-2,6-naphthalate; polyamide such as nylon 6, nylon 66, nylon 12 or copolymer nylon; ethylene-vinyl acetate copolymer partial hydrolysate (EVOH), polyimide, polyetherimide, polysulfone, polyethersulfone, polyether ether ketone, polycarbonate (PC), polyvinyl butyral, polyallylate, fluororesin, acrylate resin, and biodegradable resin such as olylactic acid, succinic acid or starch. Among these raw materials, polyester, polyamide, polyolefin and biodegradable resin are preferable The base material of the present invention is preferably made of the above resins as the raw material and may be an undrawn base material or a drawn base material. Alternatively, the base material may be laminated with the other plastic base material.

This base material is preferably a base material in the form of a film in view of productivity of a thin film and can be produced by a conventionally known method.

For example, a substantially amorphous and non-oriented undrawn film can be produced by melting a raw resin in an extruder and extruding the molten resin through a cyclic die or a T-die, followed by quenching. A film drawn in the monoaxial direction can be produced by drawing in the flow (longitudinal) direction of the film or the (cross) direction perpendicular to the flow direction of the film using a conventionally known method such as monoaxial drawing, Tenter type successive biaxial drawing, Tenter type simultaneous biaxial drawing or tubular type simultaneous biaxial drawing method. The thickness of the film is usually selected within a range from 5 to 500 μm, and preferably from 10 to 200 μm, according to the purposes, for example, taking account of mechanical strength, flexibility and transparency required to the base material of the laminate of the present invention. The width and the length of the film are not specifically limited and can be appropriately selected according to the purposes.

To improve adhesion between the base material and the inorganic thin film, an anchor coat layer is preferably formed between the base material and the inorganic thin film. As the method of forming the anchor coat layer, coating an anchor coating agent on the surface of the base material can be employed and the inorganic thin film may be formed on the anchor coat layer thus formed.

As the anchor coating agent, for example, there can be used solvent soluble or water soluble polyester resin, isocyanate resin, urethane resin, acrylic resin, vinyl alcohol resin, ethylene vinyl alcohol resin, vinyl-modified resin, epoxy resin, oxazoline group-containing resin, modified styrene resin, modified silicone resin and alkyl titanate alone or in combination.

The thickness of the anchor coat layer is usually from 0.005 to 5 μm, and preferably from 0.01 to 1 μm. When the thickness is more than 5 μm, slipperiness may deteriorate and the anchor coat layer is likely to be peeled off from the film- or sheet-like base material by internal stress of the anchor coat layer itself. On the other hand, when the thickness is less than 0.005 μm, uniform thickness may not be attained.

To improve coatability and adhesion of the anchor coating agent to the film, the surface of the base material may be subjected to a chemical treatment or a discharge treatment before coating.

As the inorganic substance constituting the inorganic thin film to be formed on the base material, silicon oxide is most preferable because it is easily formed by the vacuum deposition method and excellent gas barrier properties can be stably maintained. The inorganic thin film can contain, in addition to silicon oxide, other metal components (including metal compounds, the same shall apply hereinafter). Examples of the metal component include oxide, carbide and nitride of metals such as aluminum, magnesium, potassium, lithium, calcium, sodium, titanium, lead, tin, and their mixtures.

The thickness of the inorganic thin film is usually from 0.1 to 500 nm, and preferably from 0.5 to 40 nm. When the inorganic thin film is too thin, sufficient gas barrier properties can not be obtained with ease. On the other hand, if the inorganic thin film is too thick, the deposited film may cause cracking or peeling, or transparency may deteriorate.

In the gas barrier film of the first invention according to the present invention, it is necessary that the radical density of the Pb center of the silicon oxide film observed by the ESR method using silicon oxide as the inorganic substance is preferably from $1\times10^{16}$ to $1\times10^{19}$ spins/cm$^3$, and more preferably from $1\times10^{17}$ to $8\times10^{18}$ spins/cm$^3$.

The radical density of the Pb center can be calculated by a comparative determination method using the ESR method.

Gas barrier properties are improved by adjusting the radical density of the Pb center within the above range.

The radical density of the Pb center of the inorganic thin film can be controlled by controlling the amount of the inorganic thin film to be deposited while introducing a gas such as oxygen during the deposition. It can also be controlled by irradiating an evaporation material with electron beam or ion beam during the deposition.

Although optimum conditions suited for obtaining gas barrier properties vary depending on the kind of a deposition apparatus, film formation conditions can be optimized by measuring the radical density of the Pb center while varying the deposition conditions.

Gas barrier properties can be improved by decreasing the radical concentration of the Pb center by subjecting to a heat treatment, a hot water treatment, an electron beam treatment, an ultraviolet treatment or radical trapping agent coating treatment after forming the inorganic thin film.

It is particularly preferable to coat an acidic solution such as hydrochloric acid, sulfuric acid, nitric acid, acetic acid or phosphoric acid. The acidic solution preferably has a pH within a range from 2 to 6.5, and preferably from 3 to 6. When the pH is less than 2, barrier properties deteriorate by damage to the inorganic thin film. When the pH is more than 6.5, there is exerted less effect of decreasing radical density.

In the second embodiment according to the present invention, it is necessary that the radical concentration of the Pb center of silicon oxide in the inorganic thin film is adjusted within a range from $3\times10^{14}$ to $3\times10^{17}$ spins/mol, and preferably from $3\times10^{15}$ to $2\times10^{17}$ spins/mol using an inorganic thin film composed of silicon oxide and a metal component other than silicon oxide.

When the inorganic thin film contains the metal component other than silicon oxide, gas barrier properties are improved by adjusting the radical concentration of the Pb center of silicon oxide within the above range.

The radical density of the Pb center of silicon oxide is calculated by a comparative determination method using the above ESR method. When an element other than silicon coexists in the inorganic thin film, an element ratio of the inorganic thin film is determined using an X-ray photoelectron spectroscope and the radical concentration of the Pb center per 1 mol of silicon can be calculated from the specific gravity and the thickness of the thin film determined by a density-gradient tube method after removing the thin film.

In the third embodiment according to the present invention, it is necessary that a ratio of radical density (S2) of the Pb center measured after heating the gas barrier film at 120° C. for 24 hours to radical density (S1) of the Pb center of the inorganic thin film observed by an ESR method, (S2/S1), is 0.5 or more. The inorganic thin film in which S2/S1 is 0.5 or more causes less change in gas barrier properties with time and is also excellent in gas barrier properties.

As described above, S2/S1 can be adjusted to 0.5 or more by controlling radical density.

When the radical density of the Pb center increases, the number of bonds between atoms may decrease. It is estimated that, when the ratio exceeds the above numerical value, defects arise in the thin film and barrier properties deteriorate.

In any of the above embodiments, a top coat layer is preferably formed on the inorganic thin film formed on the base material so as to improve protection and adhesion.

Examples of the top coat layer include layers made of solvent soluble or water soluble polyester resin, isocyanate resin, urethane resin, acrylic resin, vinyl alcohol resin, EVOH resin, vinyl-modified resin, epoxy resin, oxazoline group-containing resin, modified styrene resin, modified silicone resin and alkyl titanate alone or in combination. As the top coat layer, for example, there can be used a layer made of a mixture obtained by mixing at least one kinds of inorganic particles selected from silica sol, alumina sol, particulate inorganic filler and layered inorganic filler with at least one resin described above so as to improve barrier properties, abrasivity and slipperiness, or a top coat layer made of a resin containing inorganic particles obtained by polymerizing the raw material of the above resin in the presence of the inorganic particles. Among these layers, a top coat layer made of at least one resin selected from polyester resin, urethane resin, acrylic resin and oxazoline group-containing resin, and a top coat layer made of the above resin obtained by adding at least one selected from silica sol, alumina sol, particulate inorganic filler and layered inorganic filler to the resin, or the resin obtained by polymerizing or condensing the resin in the presence of these inorganic particles is preferable.

As used herein, the raw material of the resin means a monomer constituting this resin when the resin is obtained by polymerization, and it means a material to be condensed such as diol, diamine or dicarboxylic acid when the resin is obtained by condensation.

In the above gas barrier film, the surface of the inorganic thin film layer or the surface of the top coat layer may be printed.

The printing is done by using a water- or solvent-based resin-containing ink. As the resin contained in the ink, for example, an acrylic resin, a urethane-based resin, a polyester-based resin, a vinyl chloride-based resin, a vinyl acetate copolymer resin, and a mixture thereof can be used.

To improve adhesion with the inorganic thin film, 0.01 to 5% by mass of a silane coupling agent can also be added.

Furthermore, known additives such as antistatic agents, light screening agents, ultraviolet absorbers, plasticizers, lubricants, fillers, colorants, stabilizers, defoamers, crosslinking agents, antiblocking agents and antioxidants can be added.

As the printing method, known printing methods such as offset printing method, gravure printing method and screen printing method can be used.

To dry the solvent contained in the printing ink, hot air drying, heated roll drying and infrared drying can be used.

In the gas barrier film, a ratio of a value (P2) of steam permeability measured after 48 hours to a value (P1) of steam permeability measured by the method defined in JIS K 7129B after 3 hours under the conditions of 40° C. and 90% RH, (P2/P1), is preferably 0.5 or more. This can be conducted by controlling the film formation state, deposition conditions and so on.

In the gas barrier film of the present invention, steam permeability of the gas barrier film is usually 3 g/m$^2$/day or less, preferably 2 g/m$^2$/day or less, and more preferably 1.2 g/m$^2$/day or less. The lower limit is usually 0.0001 g/m$^2$/day or more.

Various gas barrier laminates obtained by laminating constituent layers other than those described above on the gas barrier film are preferably used according to the purposes. Such a gas barrier laminate will now be described.

Examples of the gas barrier laminate of the present invention include those obtained by laminating a heat seal layer made of a heat sealable resin film on the surface of the inorganic thin film, the surface of the top coat layer or the surface of the printed layer of the gas barrier film. This gas barrier laminate is heat sealable with ease.

Examples of the heat sealable resin include known resins such as polyethylene resin, polypropylene resin, EVOH resin, ionomer resin, EAA (ethylene-acrylic acid) resin, EMAA (ethylene-methacrylic acid) resin, EMA (ethylene-methyl acrylate) resin, EMMA (ethylene-methyl methacrylate) resin and EEA (ethylene-ethyl acrylate) resin.

Examples of the gas barrier laminate of the present invention include a laminate obtained by interposing at least one paper and/or plastic film between the printed layer and the heat seal layer.

The paper used in the laminate is not specifically limited and examples thereof include wood free paper, art paper and coat paper.

The thickness of the plastic film to be laminated is usually within a range from 5 to 500 µm, preferably from 10 to 200 µm, according the purposes, taking account of mechanical and is selected strength, flexibility and transparency of the laminate.

The width and the length of the film are not specifically limited and can be appropriately selected.

The kind of the plastic film is not specifically limited and a polyolefin-based film is preferable as a heat sealable film. As the film having excellent mechanical strength, a biaxial drawn polyester film and biaxial drawn nylon film are particularly preferable.

The inorganic thin film layer may be located between the base material and the plastic film. When two or more plastic films are laminated, an inorganic thin film layer may be formed between plastic films and the number of the inorganic thin film is not limited to one.

As the lamination method, a dry lamination method and an extrusion lamination method can be used. In this case, an adhesive may be used. As the adhesive, urethane-based, polyester-based and acrylic adhesives are preferably used.

To impart light screening properties and ultraviolet screening properties, a layer containing an ultraviolet absorber may be formed on the surface of the laminate or formed between layers.

When the laminate of the present invention is used for packaging or used as a bag, a layer containing an oxygen absorber such as iron powder may be formed on the surface of the laminate or formed between layers so as to prevent oxidation deterioration of contents. The layer containing the oxygen absorber is preferably located between the inorganic compound and the surface contacted with the contents.

In the gas barrier laminate of the present invention, a ratio of a value (P2) of steam permeability measured after 48 hours to a value (P1) of steam permeability measured by the method defined in JIS K 7129B after 3 hours under the conditions of 40° C. and 90% RH, (P2/P1), is 0.5 or more. This can be conducted by control of the film formation state, deposition conditions, selection of the heat seal layer, and selection of the paper to be laminated between the printed layer and the heat seal layer, and the plastic film.

EXAMPLES

The present invention will now be described by way of examples, but the present invention is not limited to the following examples.

Steam Permeability

Steam permeability was evaluated by the following procedure according to various conditions defined in JIS K 7129B.

Using an apparatus W-1 manufactured by Modern Controls International, Inc. and using a gas barrier laminated film measuring 10 cm×10 cm as a sample, humidity of a dry air was adjusted to 10% RH or less and steam permeability was measured for 3 hours under the conditions of a temperature of 40° C. and a relative humidity of 90%, and then zero level measurement due to the dry air was conducted. After measuring for 48 hours, zero level measurement due to the dry air was conducted.

Measurement by ESR Method

Each of the gas barrier films comprising an inorganic thin film formed therein in the respective examples and comparative examples was cut to obtain a cylindrical sample measuring 3 cm×30 cm. After inserting the sample in a measuring tube, an absorption spectrum of a radical of the Pb center was measured by ESR JES-FA300® manufactured by JEOL Ltd. Then, radical density per an inorganic thin film carrier was determined by conversion with an absorption spectrum measured by spin labeling agent, TEMPOL® manufactured by JEOL Ltd.

Calculation of Radical Concentration

In case the inorganic thin film is made of silicon oxide and a metal component other than silicon oxide, the amount of silicon in the inorganic thin film was determined in the following manner. That is, an element composition ratio of the inorganic thin film was determined using an X-ray photoelectron spectroscope ESCA® Model 850 manufactured by Shimadzu Corporation and then the amount of silicon in the inorganic thin film was determined from the specific gravity determined by a density-gradient tube method after removing the thin film and the thickness determined by an electron microscope. The radical concentration spins/mol of the Pb center per 1 mol of silicon was calculated by the amount of silicon in the inorganic thin film and the radical density determined by the ESR method.

Example 1

A polyethylene terephthalate resin (hereinafter abbreviated to PET, manufactured by Mitsubishi Chemical Corporation under the trade name of NOVAPEX®) was melt-extruded by a conventional method to form a sheet, drawn in a longitudinal direction under the conditions of drawing temperature of 95° C. and a draw ratio of 3.3 and then drawn in cross direction under the conditions of drawing temperature of 110° C. and a draw ratio of 3.3 to obtain a 12 μm thick biaxially drawn PET film. On one surface of the film, a mixture obtained by mixing an isocyanate compound (manufactured by Nippon Polyurethane Corporation under the trade name of "CORONATE® L") with a saturated polyester (manufactured by Toyobo Co., Ltd. under the trade name of VYLON® 300) in a mass ratio of 1:1 was coated and dried to form a 0.1 μm thick anchor coat layer.

Using a vacuum deposition apparatus, an oxygen gas was introduced and SiO was evaporated under vacuum of $1.3 \times 10^{-2}$ Pa by a high-frequency heating system to obtain a plastic film comprising an inorganic thin film in which a thin film having about 30 nm is formed on the anchor coat layer.

On the surface of the thin film of the inorganic thin film, a dilute hydrochloric acid having a concentration of $1 \times 10^{-3}$ mol/L was coated using a bar coater, followed by wind-drying at 80° C. for 3 minutes to obtain a gas barrier film.

Steam permeability and radical density of the Pb center having a g value of 2.003 of the gas barrier film were measured. After heating the gas barrier film in an oven at 120° C., for 24 hours, radical density of the Pb center was measured. The results are shown in Table 1.

Example 2

In the same manner as in Example 1, except that the vacuum pressure during the deposition was adjusted to $5.3 \times 10^{-2}$ Pa, a gas barrier film was obtained. The measurement results are shown in Table 1.

Example 3

In the same manner as in Example 1, except that the concentration of dilute hydrochloric acid was adjusted to $1 \times 10^{-5}$ mol/L, a gas barrier film was obtained. The measurement results are shown in Table 1.

Example 4

In the same manner as in Example 1, except that diluted sulfuric acid was used in place of dilute hydrochloric acid having the same concentration, a gas barrier film was obtained. The measurement results are shown in Table 1.

Example 5

In the same manner as in Example 1, except that SiO of the deposition material was mixed with 10% aluminum, a gas barrier film was obtained. The measurement results are shown in Table 1.

Example 6

In the same manner as in Example 1, except that carbon monoxide was used as the gas introduced during the deposition and coating of dilute hydrochloric acid was not conducted, a gas barrier film was obtained. The measurement results are shown in Table 1.

Example 7

In the same manner as in Example 1, except that the vacuum pressure during the deposition was adjusted to $6.7 \times 10^{-3}$ Pa and a heat treatment at 150° C. for one hour was conducted in place of coating of dilute hydrochloric acid, a gas barrier film was obtained. The measurement results are shown in Table 1.

Comparative Example 1

In the same manner as in Example 1, except that coating of dilute hydrochloric acid was not conducted, a gas barrier film was obtained. The measurement results are shown in Table 1.

Comparative Example 2

In the same manner as in Example 1, except that the concentration of dilute hydrochloric acid was adjusted to $1 \times 10^{-7}$ mol/L, a gas barrier film was obtained. The measurement results are shown in Table 1.

Comparative Example 3

In the same manner as in Example 1, except that the vacuum pressure during the deposition was adjusted to $6.3 \times 10^{-2}$ Pa, a gas barrier film was obtained. The measurement results are shown in Table 1.

TABLE 1

| | | RADICAL DENSITY OF PB CENTER SPINS/CM$^3$ | RADICAL CONCENTRATION OF PB CENTER SPINS/MOL | S2/S1 | STEAM PERMEABILITY G/M$^2$/DAY | P2/P1 |
|---|---|---|---|---|---|---|
| EXAMPLES | 1 | $5 \times 10^{18}$ | $2 \times 10^{17}$ | 0.7 | 0.5 | 0.9 |
| | 2 | $1 \times 10^{17}$ | $4 \times 10^{15}$ | 0.8 | 1.0 | 0.8 |
| | 3 | $8 \times 10^{18}$ | $3 \times 10^{17}$ | 0.5 | 0.7 | 0.6 |
| | 4 | $5 \times 10^{18}$ | $1 \times 10^{17}$ | 0.7 | 0.6 | 0.9 |
| | 5 | $4 \times 10^{18}$ | $1 \times 10^{17}$ | 0.7 | 0.5 | 0.9 |
| | 6 | $6 \times 10^{18}$ | $2 \times 10^{17}$ | 0.6 | 1.1 | 0.7 |
| | 7 | $3 \times 10^{18}$ | $1 \times 10^{17}$ | 1.0 | 0.3 | 1.0 |
| COMPARATIVE EXAMPLES | 1 | $1 \times 10^{20}$ | $3 \times 10^{18}$ | 0.1 | 5.4 | 0.2 |
| | 2 | $5 \times 10^{19}$ | $2 \times 10^{18}$ | 0.2 | 3.5 | 0.4 |
| | 3 | $8 \times 10^{15}$ | $2 \times 10^{14}$ | 0.4 | 15.3 | 0.3 |

In Table 1, S2/S1 denotes a ratio of radical density (S2) of the Pb center measured after heating the gas barrier film at 120° C. for 24 hours to radical density (S1) of the Pb center of the inorganic thin film observed by an ESR method. P2/P1 denotes a ratio of a value (P2) of steam permeability measured after 48 hours to a value (P1) of steam permeability measured by the method defined in JIS K 7129B after 3 hours under the conditions of 40° C. and 90% RH.

As is apparent from the results shown in Table 1, the gas barrier films comprising the silicon oxide thin film of Comparative Examples 1 to 3 in which the radical density of the Pb center is not within a range from $1 \times 10^{16}$ to $1 \times 10^{19}$ spins/cm$^3$ show high steam permeability and a low value of 0.2 to 0.4 of P2/P1, whereas, the gas barrier film of Examples 1 to 4, 6 and 7 in which the radical density of the Pb center is from $1 \times 10^{16}$ to $1 \times 10^{19}$ spins/cm$^3$ and the gas barrier film of Example 5 in which the radical concentration of the Pb center of the inorganic thin film is from $3 \times 10^{14}$ to $3 \times 10^{17}$ spins/mol are excellent in gas barrier properties and are also excellent in durability of gas barrier properties because of low steam permeability and a high value of P2/P1.

INDUSTRIAL APPLICABILITY

The gas barrier film and the laminate of the present invention are suited for packaging applications such as packaging of articles requiring barrier of various gases such as steam and oxygen and packaging for prevention of deterioration of foods, industrial products and drugs; and applications of a portion of transparent conductive sheet used in liquid crystal display, solar battery, electromagnetic wave shielding, touch panel, substrate for EL, and color filter.

The invention claimed is:

1. A gas barrier film comprising a base material, and an inorganic thin film comprising a silicon oxide film formed on one or both surfaces of the base material, wherein radical density of the Pb center of the silicon oxide film observed by an electron spin resonance method (ESR method) is from $1 \times 10^{16}$ to $1 \times 10^{19}$ spins/cm$^3$, the thickness of the inorganic thin film is from 0.1 to 500 nm, and the inorganic thin film further comprises an inorganic substance selected from silicon, aluminum, magnesium, potassium, lithium, calcium, sodium, titanium, lead, and tin, or an oxide thereof, a carbide thereof or a nitride thereof.

2. The gas barrier film according to claim 1, wherein the thickness of the inorganic thin film is from 0.5 to 40 nm.

3. The gas barrier film according to claim 1, wherein the base material is at least one selected from polyester, polyamide, polyolefin and biodegradable resin.

4. The gas barrier film according to claim 1, wherein an anchor coat layer is formed between the base material and the inorganic thin film.

5. The gas barrier film according to claim 4, wherein the anchor coat layer is formed of at least one resin selected from the group consisting of polyester resin, urethane resin, acrylic resin and oxazoline group-containing resin.

6. The gas barrier film according to claim 1, wherein a top coat layer is formed on the surface of at least one inorganic thin film.

7. The gas barrier film according to claim 6, wherein the top coat layer is a layer made of at least one resin selected from polyester resin, urethane resin, acrylic resin, vinyl alcohol-based resin and oxazoline group-containing resin, or made of a resin containing, inorganic particles formed by mixing at least one kind of inorganic particles selected from silica sol, alumina sol, particulate inorganic filler and layered inorganic filler with at least one resin, or polymerizing a raw material of the resin in the presence of the inorganic particles.

8. A gas barrier laminate comprising the gas barrier film of claim 6, a printed layer formed on the surface of the top coat of the gas barrier film, and a heat seal layer laminated on the printed layer.

9. The gas barrier film according to claim 1, wherein a ratio of a value (P2) of steam permeability measured after 48 hours to a value (P1) of steam permeability measured by the method defined in JIS K 7129B after 3 hours under the conditions of 40° C. and 90% RH, (P2/P1), is 0.5 or more.

10. A gas barrier laminate comprising the gas barrier film of claim 1, a printed layer formed on the surface of the inorganic thin film of the gas barrier film, and a heat seal layer laminated on the printed layer.

11. The gas barrier laminate according to claim 10, wherein at least one paper and/or plastic film is formed between the printed layer and the heat seal layer.

12. The gas barrier laminate according to claim 10, wherein a ratio of a value (P2) of steam permeability measured after 48 hours to a value (P1) of steam permeability measured by the method defined in JIS K 7129B after 3 hours under the conditions of 40° C. and 90% RH, (P2/P1), is 0.5 or more.

13. A gas barrier film comprising a base material, and
an inorganic thin film comprising silicon oxide and the other metal component formed on one or both surfaces of the base material, wherein radical density of the Pb center of the silicon oxide in the inorganic thin film observed by an ESR method is from $13 \times 10^{14}$ to $3 \times 10^{17}$ spins/mol, and wherein the thickness of the inorganic thin film is from 0.1 to 500 nm.

14. A gas barrier film comprising a base material, and an inorganic thin film comprising silicon oxide formed on one or both surfaces of the base material, wherein a ratio of radical density (S2) of the Pb center measured after heating the gas barrier film at 120° C. for 24 hours to radical density (S1) of the Pb center of the inorganic thin film observed by an ESR method, (S2/S1), is 0.5 or more, and wherein the thickness of the inorganic thin film is from 0.1 to 500 nm.

* * * * *

UNITED STATES PATENT AND TRADEMARK OFFICE
CERTIFICATE OF CORRECTION

| | |
|---|---|
| PATENT NO. | : 7,678,448 B2 |
| APPLICATION NO. | : 10/597425 |
| DATED | : March 16, 2010 |
| INVENTOR(S) | : Tooru Hachisuka et al. |

Page 1 of 1

It is certified that error appears in the above-identified patent and that said Letters Patent is hereby corrected as shown below:

On the title page, Item (73), the Assignee information is incorrect. Item (73) should read:

-- (73) Assignee: Mitsubishi Plastics Inc., Tokyo (JP);
National Institute of Advanced Industrial Science and Technology, Tokyo (JP) --

Signed and Sealed this
Second Day of April, 2013

Teresa Stanek Rea
*Acting Director of the United States Patent and Trademark Office*